United States Patent [19]

Buhrer

[11] 4,366,410

[45] Dec. 28, 1982

[54] VACUUM-TIGHT ASSEMBLY PARTICULARLY FOR A DISCHARGE TUBE

[75] Inventor: Carl F. Buhrer, Framingham, Mass.

[73] Assignee: GTE Laboratories Incorporated, Waltham, Mass.

[21] Appl. No.: 209,242

[22] Filed: Nov. 21, 1980

[51] Int. Cl.[3] .................... H01J 61/30; F16D 1/00; H05K 15/16; H01B 17/06

[52] U.S. Cl. .................... 313/221; 220/2.1 R; 313/220; 403/28

[58] Field of Search .................... 313/220, 221; 220/2.1 R; 403/28

[56] References Cited

U.S. PATENT DOCUMENTS

| | | | |
|---|---|---|---|
| 3,061,664 | 10/1962 | Kegg | 220/2.1 R |
| 3,275,358 | 9/1966 | Shonebarger | 403/179 |
| 3,435,180 | 3/1969 | Kershaw | 174/50.61 |
| 3,588,573 | 6/1971 | Chen . | |
| 3,588,577 | 6/1971 | McVey . | |
| 3,761,744 | 2/1973 | Delombre . | |
| 3,848,151 | 11/1974 | McVey . | |
| 3,882,344 | 5/1975 | Knochel et al. | 313/220 |
| 4,004,173 | 1/1977 | Rigden . | |
| 4,160,186 | 7/1979 | Kerekes . | |
| 4,197,957 | 4/1980 | Buhrer | 220/2.1 R |
| 4,291,250 | 9/1981 | Bhalla | 313/220 |

FOREIGN PATENT DOCUMENTS

| | | |
|---|---|---|
| 1496323 | 9/1975 | United Kingdom . |
| 1465212 | 2/1977 | United Kingdom . |

OTHER PUBLICATIONS

Hansen, *Constitution of Binary Alloys*, McGraw-Hill, N.Y., 1958, pp. 537-539, 976-978 & 980.

*Thermophysical Properties of Matter*, IFI-Plenum, N.Y. 1975, vol. 12, pp. 923-925 & 713-718.

*Primary Examiner*—Alfred E. Smith

*Assistant Examiner*—T. N. Grigsby

*Attorney, Agent, or Firm*—William R. McClellan; Ivan L. Ericson

[57] ABSTRACT

A vacuum-tight assembly, such as a discharge tube for a sodium vapor arc lamp, includes a high density polycrystalline ceramic body, such as alumina or yttria, having a cavity and at least one closure member and a sealing material for sealing the cavity from the atmosphere. The closure member is formed from a molybdenum alloy containing titanium, vanadium, chromium or mixtures thereof. The closure member and the sealing material have thermal coefficients of expansion closely matched to the thermal coefficient of expansion of the ceramic body over a wide temperature range. In a preferred embodiment, an alumina discharge tube is sealed by a closure member formed from a molybdenum alloy containing 50 atom percent titanium.

9 Claims, 3 Drawing Figures

VACUUM-TIGHT ASSEMBLY PARTICULARLY FOR A DISCHARGE TUBE

CROSS REFERENCE TO RELATED APPLICATION

Buhrer et al., "Vacuum-Tight Assembly", assignee's Ser. No. 209,162, and now U.S. Pat. No. 4,334,628, filed concurrently with the present application and assigned to the same assignee as the present application, discloses portions of the subject matter herein disclosed.

BACKGROUND OF THE INVENTION

This invention relates to sealing of cavities in high density polycrystalline ceramic bodies and, more particularly, to the sealing of high pressure discharge lamps composed of alumina, yttria and the like.

Electrical discharge devices, such as high pressure sodium vapor arc lamps, commonly utilize transparent or translucent high temperature refractory tubes composed of alumina. Within the alumina tube an electric arc extends between two tungsten electrodes to which current is conducted by a hermetically sealed feedthrough assembly. Because alumina and niobium metal have nearly equal thermal coefficients of expansion, a niobium tube or a niobium wire is used in high pressure sodium vapor lamps to conduct electrical current through the ends of the alumina arc tube. The joint between the niobium metal and the alumina is typically filled with a meltable frit based on calcium aluminate. Thus, the feedthrough assembly not only seals the discharge tube but also conducts electrical current through the end of the alumina arc tube.

While niobium is generally satisfactory as a closure member for alumina arc tubes, it is a relatively expensive metal and is in potentially short supply under certain world conditions. It is, therefore, desirable to provide a substitute for niobium in the sealing of high pressure arc discharge tubes.

SUMMARY OF THE INVENTION

According to the present invention, a vacuum tight assembly includes a high density polycrystalline ceramic body having a cavity and means for sealing the cavity from the atmosphere. The ceramic body has a thermal coefficient of expansion between about $55\times10^{-7}/°C.$ and $105\times10^{-7}/°C.$ The means for sealing comprises at least one closure member formed from a molybdenum alloy containing between 2 and 98 atom percent of a metal selected from the group consisting of titanium, vanadium, chromium and mixtures thereof and a sealing material. The closure member and the sealing material have thermal coefficients of expansion closely matched to the thermal coefficient of expansion of the ceramic body over a wide temperature range.

According to one preferred embodiment of the invention, an alumina discharge tube is sealed by a closure member formed from a molybdenum alloy containing between 35 and 65 atom percent titanium.

Figure 1:
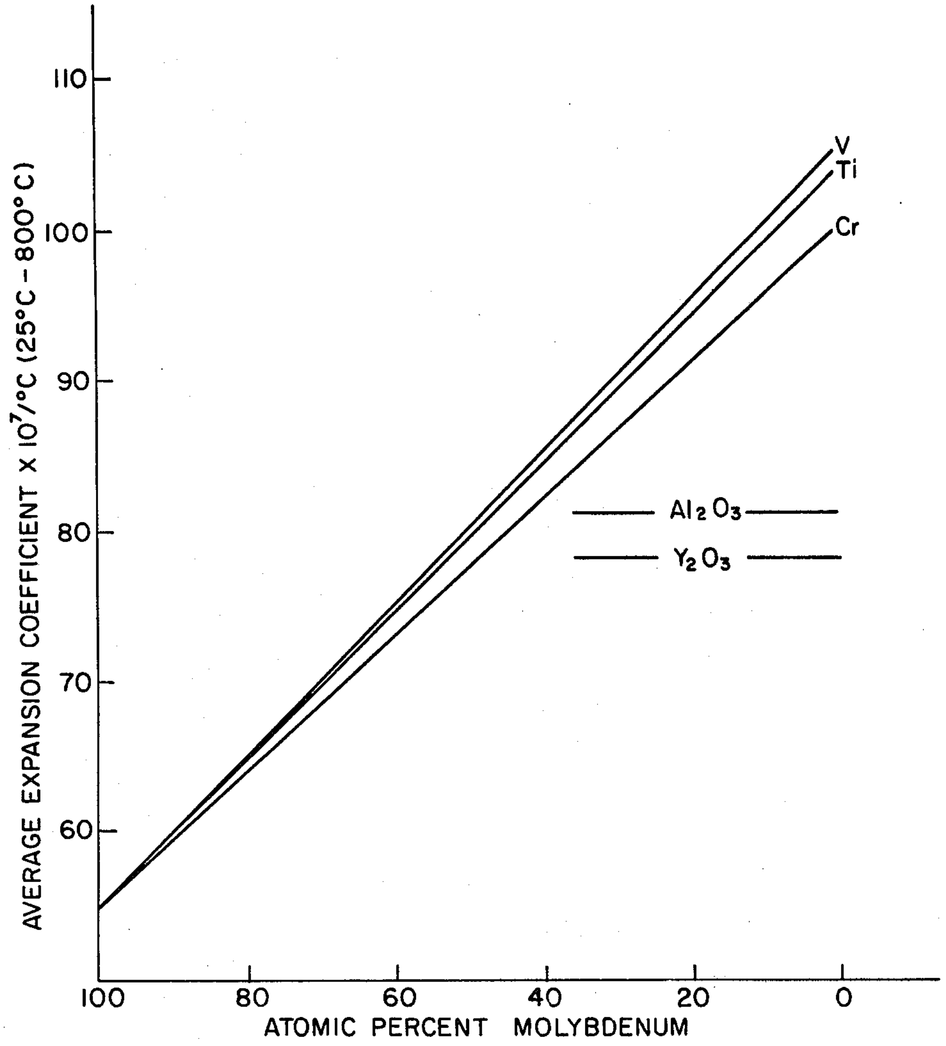
FIG. 1 is a graphic diagram illustrating the average thermal expansion coefficients of various molybdenum alloys as a function of atom percent molybdenum.

For a better understanding of the present invention, together with other and further objects, advantages and capabilities thereof, reference is made to the following disclosure and appended claims in connection with the above-described drawings.

DETAILED DESCRIPTION OF THE INVENTION

A polycrystalline ceramic body, such as a high pressure discharge tube, having a cavity is sealed with a molybdenum alloy and a sealing material to form a vacuum-tight assembly. Polycrystalline alumina, having an average thermal expansion coefficient of $81\times10^{-7}/°C.$ between the temperatures of 25° C. and 800° C., is commonly used for discharge tubes in high pressure sodium vapor arc lamps. Yttria, having an average thermal expansion coefficient of $78\times10^{-7}/°C.$ between 25° C. and 800° C., is also used in the fabrication of discharge tubes.

The operational temperature of the seal region of high pressure sodium discharge tubes is typically between ambient temperature, or about 25° C., when the device is turned off and 800° C. when fully warmed up. To avoid cracking or other destruction of the hermetic seal between the ceramic body and the closure member, it is necessary that the closure member and the sealing material have thermal coefficients of expansion closely matched to the thermal coefficient of expansion of the ceramic body over the operating temperature range of the seal region. While high pressure sodium discharge tubes have a typical operating temperature range between 25° C. and 800° C., other vacuum-tight assemblies according to the present invention can experience greater or lesser operating temperature ranges and thus require matching of thermal expansion coefficients over a correspondingly greater or lesser temperature range. The closure members and the sealing material should have thermal coefficients of expansion which are matched within seven percent to the thermal coefficient of expansion of the ceramic body to provide a reliable seal.

Although the maximum temperature of the seal region of the discharge tube during normal operation is about 800° C., the process used to seal the discharge tube employs temperatures of about 1400° C. Therefore, the closure member material must have a relatively high melting point. In addition, the material used to seal the discharge tube should have a low vapor pressure in order to avoid darkening of the lamp outer jacket and should be unreactive toward the discharge tube fill material.

According to the present invention, molybdenum is alloyed with titanium, vanadium, chromium, or mixtures thereof to form a closure member for a cavity in a polycrystalline ceramic body. Vanadium and chromium have body centered cubic structures which form a continuous series of body centered cubic solid solutions with molybdenum. Titanium forms a continuous series of body centered cubic solid solutions with molybdenum above 882° C. or when the titanium concentration is below a critical concentration that decreases with decreasing temperature. A second hexagonal phase can separate at higher titanium concentrations as shown by Hansen in "Constitution of Binary Alloys", McGraw-Hill, New York, 1958, pp. 976–978. In the preferred composition range for sealing alumina, the titanium concentration is between 35 and 65 atom percent and the temperature at which a second phase of α-Ti can precipitate is between room temperature and 400° C. Although these alloys are allowed to cool below this temperature range, no evidence of such α-Ti phase separation has been seen in x-ray diffraction patterns, probably because of the slow kinetics of such a low temperature phase precipitation. The absence of intermetallic compounds in the molybdenum alloys of the present invention insures that closure members formed therefrom are not brittle.

Molybdenum, a refractory metal, has an average thermal expansion coefficient of $55\times10^{-7}$/°C. between 25° C. and 800° C. Titanium, vanadium and chromium have average thermal expansion coefficients of $104\times10^{-7}$/°C., $105\times10^{-7}$/°C., and $100\times10^{-7}$/°C., respectively, between 25° C. and 800° C. By properly selecting the ratio of the component metals in the molybdenum alloy, the average thermal expansion coefficient between 25° C. and 800° C. is adjusted upward from that of molybdenum, such that it closely matches the thermal expansion coefficient of the ceramic body to be sealed. For example, a molybdenum-titanium alloy containing 50 atom percent of each element has an average thermal expansion coefficient of $81\times10^{-7}$/°C. between 25° C. and 800° C. Therefore, this alloy has a coefficient of thermal expansion substantially equal to that of alumina and can be used as a closure member for alumina arc discharge tubes. Other thermal coefficients of expansion between about $55\times10^{-7}$/°C. and $105\times10^{-7}$/°C. can be attained by varying the concentration of titanium, vanadium or chromium relative to molybdenum. The thermal coefficient of expansion of the molybdenum alloy increases more or less linearly from $55\times10^{-7}$/°C. as the concentration of titanium, vanadium, or chromium is increased. The average thermal coefficients of expansion of molybdenum-vanadium, molybdenum-titanium, and molybdenum-chromium alloys are plotted in FIG. 1 as a function of atom percent molybdenum. The values for the molybdenum-vanadium and mollybdenum-chromium alloys were derived from thermal expansion data in "Thermophysical Properties of Matter" (IFI-Plenum, New York, 1975), Vol. 12 pp. 923–925 and pp. 713–718, respectively. The values for the molybdenum-titanium alloys were measured as described hereinafter in Examples I and III. In formulating these alloys for a thermal expansion coefficient above about $85\times10^{-7}$/°C., the possible phase separation of α-Ti should be avoided by using molybdenum and either vanadium or chromium rather than titanium or by using titanium in combination with vanadium as well as molybdenum in a ternary alloy. The latter approach gives a less costly alloy and is effective because vanadium also suppresses the separation of α-Ti in high titanium content alloys.

Figure 2:
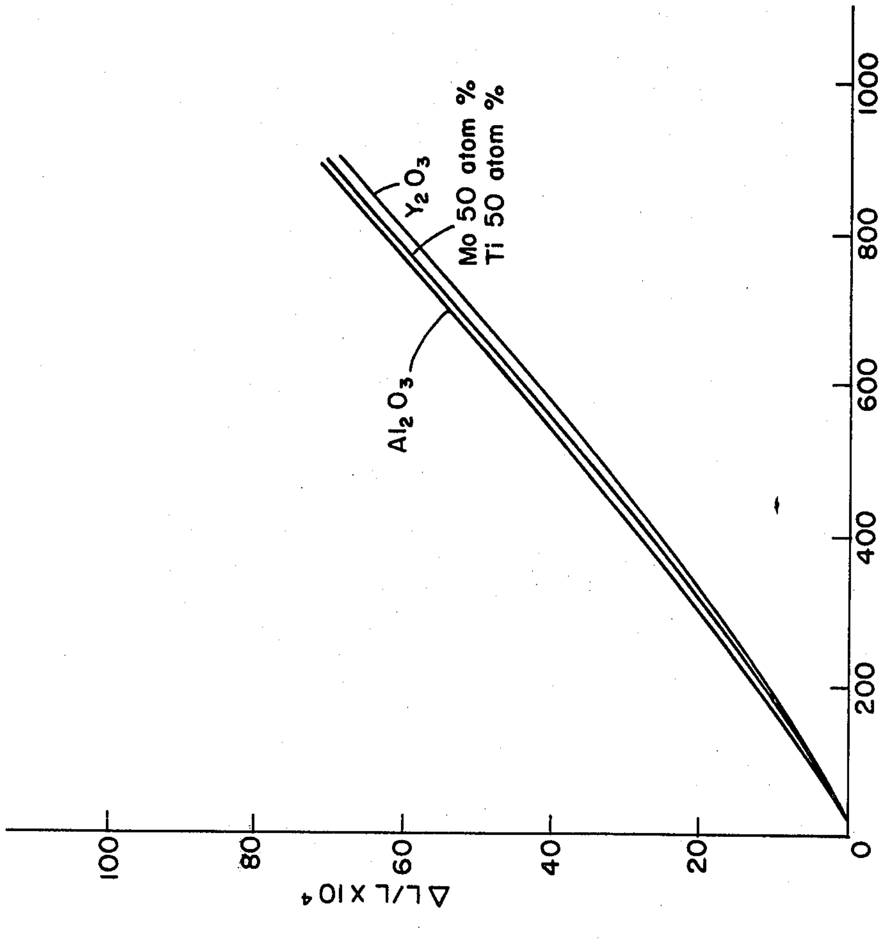
FIG. 2 is a graphic diagram illustrating the thermal expansion of alumina, yttria, and a molybdenum-titanium alloy as a function of temperature.

Referring now to FIG. 2, there is shown a graphic diagram illustrating the expansion curves of alumina, yttria and a molybdenum alloy containing 50 atom percent titanium as a function of temperature. The closely matched thermal characteristics of alumina and the molybdenum alloy of the present invention are illustrated in FIG. 2. FIG. 2 also illustrates the matching in thermal characteristics between yttria and the molybdenum alloy of the present invention.

The molybdenum alloy containing between 2 and 98 atom percent of a metal selected from the group consisting of titanium, vanadium, chromium and mixtures thereof can be used as the closure member for sealing a cavity in a high density polycrystalline ceramic body when the ceramic body has a thermal coefficient of expansion between about $55\times10^{-7}$/°C. and $105\times10^{-7}$/°C. When the ceramic body is alumina or yttria, it is preferred that the molybdenum alloy contain between 35 and 65 atom percent of a metal selected from the group consisting of titanium, vanadium, chromium and mixtures thereof. A molybdenum alloy containing between 35 and 65 atom percent titanium is particularly preferred as a closure member for the sealing of alumina. When the metal alloyed with the molybdenum is outside the range of 35 to 65 atom percent, the resultant molybdenum alloy does not have thermal characteristics which sufficiently match those of alumina or yttria to provide reliable sealing.

The molybdenum alloys of the present invention can be prepared by arc melting appropriate quantities of pure elements. Pieces of molybdenum rod or wire and titanium or vanadium metal sponge or chips are placed on a water cooled copper hearth in an electric arc melter and heated to the melting point by a high power electric arc in argon purified by passage over hot titanium. The titanium or vanadium melts first and dissolves the molybdenum as the temperature is increased. Care must be taken to insure complete dissolution of the molybdenum. Alternatively, metal powders of molybdenum and titanium, vanadium, or chromium are mixed, pressed into a pellet, vacuum out-gassed and arc melted as above. In both cases, the resulting ingot is annealed at 1300°–1700° C. for about one hour, cooled, cut and machined to the desired size and shape to form a closure member for an arc discharge tube.

Figure 3:
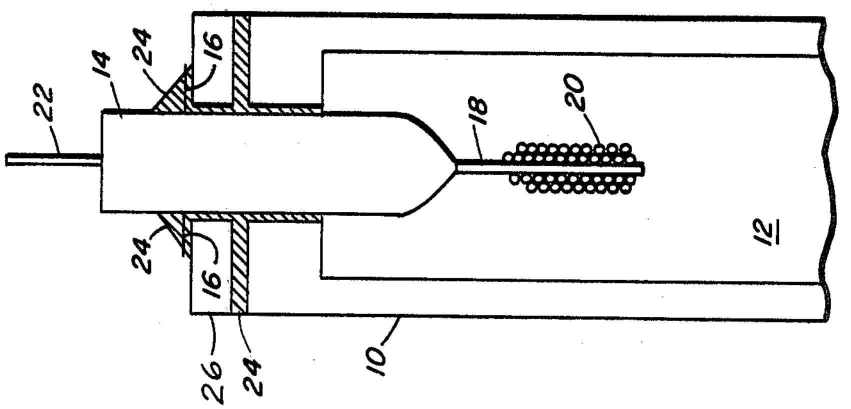
FIG. 3 is a cross-sectional view of a vacuum-tight assembly according to the present invention.

Referring now to FIG. 3, there is shown a vacuum-tight feedthrough assembly for a high pressure sodium vapor lamp. A discharge tube 10 formed from alumina, yttria or other transparent ceramic material includes a cavity 12 which contains the lamp fill material and an opening through an end thereof. A closure member 14 formed from a molybdenum alloy, as described hereinabove, is located in the opening in the discharge tube 10. The closure member 14 can be solid or tubular and is slightly smaller than the opening in the discharge tube 10. Molybdenum wires 16 spot welded to the closure member 14 hold the closure member 14 in position during the sealing process. An electrode assembly includes a tungsten rod 18 and a tungsten coil 20 impregnated with emissive activator material such as calcium barium tungstate. The tungsten rod 18 and a molybdenum connection lead 22 are pressed into holes at opposite ends of the closure member 14 and welded tight in an inert gas by an electric arc or laser beam.

During sealing of the discharge tube 10, a ring of sealing material 24 and a ceramic washer 26 are placed over the opening in the discharge tube 10. The closure member 14, with the tungsten rod 18, the tungsten coil 20 and the connection lead 22 in place, is positioned through the washer into the opening in the discharge tube 10. The sealing material 24 is typically a ring pressed from a meltable frit based on calcium aluminate. Compositions useful as sealants for alumina are well known in the prior art and have been used in conjunction with niobium feedthrough assemblies. Thus, the sealing material 24 is sandwiched between the discharge tube 10 and the ceramic washer 26. The assembly is then heated in the feedthrough region to about 1400° C. to melt the sealing material 24 and cause it to flow into the spaces between the discharge tube 10, the closure member 14 and the ceramic washer 26, thereby providing a vacuum-tight feedthrough assembly.

The following examples are for the purpose of further illustrating and explaining the present invention and are not to be taken as limiting in any regard. Unless otherwise indicated, all parts and percentages are by weight.

EXAMPLE I

A molybdenum alloy containing 33.3 percent titanium by weight, which is equivalent to 50 atom percent titanium, was prepared by arc melting in purified argon as described hereinabove. The thermal expansion of a ⅛"×⅛"×0.8955" long specimen was measured using a dilatometer calibrated against platinum. The thermal expansion of the molybdenum alloy is plotted in FIG. 2. The average thermal coefficient of expansion between 25° C. and 800° C. was determined to be $80.7\times10^{-7}$/°C.

EXAMPLE II

A sample of a molybdenum alloy containing 50 atom percent titanium was prepared by arc melting in purified argon. After annealing at 1700° C. for one hour, a sample was machined to a cylindrical configuration having a 0.125" outside diameter. The sample was sealed in a 150 watt high pressure sodium lamp alumina discharge tube using the sealing configuration shown in FIG. 3 and described hereinabove with the exception that the tungsten rod 18, the tungsten coil 20, and the connection lead 22 were omitted. The sealing material was a standard frit based on calcium aluminate. The sample was raised to 1400° C. to melt the sealing material and complete the seal. The assembly was cycled between room temperature and 800° C. in the sealing furnace at 200 torr argon. The assembly was then cycled three times between 200° C. and 800° C. The assembly was leak checked after the temperature cycling and found to be vacuum-tight.

EXAMPLE III

Several molybdenum alloys were prepared containing various atom percentages of titanium by arc melting in purified argon as described hereinabove. After annealing at 1700° C. for one hour, specimens were fabricated for measurements of their thermal expansion. Results are tabulated below.

| Atom % Ti in Mo Alloy | Average Thermal Coefficient of Expansion (25-800° C.) |
|---|---|
| 10 | $58.0\times10^{-7}$/°C. |
| 20 | $65.5\times10^{-7}$/°C. |
| 30 | $70.7\times10^{-7}$/°C. |
| 40 | $75.3\times10^{-7}$/°C. |
| 50 | $80.7\times10^{-7}$/°C. |
| 66.7 | $88.5\times10^{-7}$/°C. |

While there has been shown and described what is at present considered the preferred embodiments of the invention, it will be obvious to those skilled in the art that various changes and modifications may be made therein without departing from the scope of the invention as defined by the appended claims.

What is claimed is:

1. A vacuum-tight assembly comprising a high density polycrystalline ceramic body having a cavity and means for sealing said cavity from the atmosphere, said ceramic body having a thermal coefficient of expansion between about $55\times10^{-7}$/°C. and $105\times10^{-7}$/°C., said means for sealing comprising at least one closure member formed from a molybdenum alloy containing between 2 and 98 atom percent of a metal selected from the group consisting of titanium, vanadium, chromium, and mixtures thereof and a sealing material, said closure member and said sealing material having thermal coefficients of expansion closely matched to the thermal coefficient of expansion of said ceramic body over a wide temperature range.

2. A vacuum-tight assembly as defined in claim 1 wherein said ceramic body includes a material selected from the group consisting of alumina and yttria.

3. A vacuum-tight assembly as defined in claim 2 wherein said closure member is formed from a molybdenum alloy containing between 35 and 65 atom percent of a metal selected from the group consisting of titanium, vanadium, chromium, and mixtures thereof.

4. A vacuum-tight assembly as defined in claim 3 wherein said ceramic body comprises a cylindrical discharge tube and wherein said closure member is adapted for sealing an end of said discharge tube.

5. A vacuum-tight assembly as defined in claim 2 wherein said ceramic body includes alumina.

6. A vacuum-tight assembly as defined in claim 5 wherein said closure member is formed from a molybdenum alloy containing between 35 and 65 atom percent titanium.

7. A vacuum-tight assembly as defined in claim 6 wherein said ceramic body comprises a cylindrical discharge tube and wherein said closure member is adapted for sealing an end of said discharge tube.

8. A vacuum-tight assembly as defined in claim 1 wherein said closure member and said sealing material have thermal coefficients of expansion closely matched to the thermal coefficient of expansion of said ceramic body over the operating temperature range of said assembly.

9. A vacuum-tight assembly as defined in claim 3 wherein said closure member and said sealing material have thermal coefficient of expansion matched within seven percent to the thermal coefficient of expansion of said ceramic body over the temperature range 25° C. to 800° C.

* * * * *